US009419635B2

(12) United States Patent
Kumar et al.

(10) Patent No.: US 9,419,635 B2
(45) Date of Patent: Aug. 16, 2016

(54) TIME-TO-DIGITAL CONVERTER AND METHOD THEREFOR

(75) Inventors: Priyanka Kumar, Eindhoven (NL);
Robert Staszewski, PA Delft (NL);
Edoardo Charbon, The Hague (NL)

(73) Assignee: FASTREE 3D BV, The Hague (NL)

( * ) Notice: Subject to any disclaimer, the term of this patent is extended or adjusted under 35 U.S.C. 154(b) by 58 days.

(21) Appl. No.: 14/343,932

(22) PCT Filed: Sep. 10, 2012

(86) PCT No.: PCT/EP2012/067673
§ 371 (c)(1),
(2), (4) Date: Mar. 10, 2014

(87) PCT Pub. No.: WO2013/034771
PCT Pub. Date: Mar. 14, 2013

(65) Prior Publication Data
US 2014/0226166 A1   Aug. 14, 2014

(51) Int. Cl.
| | |
|---|---|
| G01B 11/24 | (2006.01) |
| H03M 1/00 | (2006.01) |
| G01T 1/164 | (2006.01) |
| G04F 10/00 | (2006.01) |
| H04N 5/378 | (2011.01) |
| H04N 13/02 | (2006.01) |

(52) U.S. Cl.
CPC ............... *H03M 1/002* (2013.01); *G01B 11/24* (2013.01); *G01T 1/1647* (2013.01); *G04F 10/005* (2013.01); *H04N 5/378* (2013.01); *H04N 13/02* (2013.01); *H04N 2213/001* (2013.01)

(58) Field of Classification Search
CPC .............................. G01B 11/24; G01B 11/30
USPC ......................................................... 356/601
See application file for complete search history.

(56) References Cited

U.S. PATENT DOCUMENTS

| | | | | |
|---|---|---|---|---|
| 5,926,219 A | * | 7/1999 | Shimizu | H04N 5/232 348/222.1 |
| 7,636,150 B1 | * | 12/2009 | McCauley | G01S 7/4863 356/5.01 |
| 7,750,305 B2 | * | 7/2010 | Solf | G01T 1/2985 250/363.04 |
| 2006/0202129 A1 | | 9/2006 | Niclass et al. | |

OTHER PUBLICATIONS

International Search Report dated Mar. 7, 2013, corresponding to PCT/EP2012/067673.
Markovic Bojan, et al.; "Smart-Pixel With SPAD Detector and Time-To-Digital Converter for Time-Correlated Single Photon Counting"; Nov. 7, 2010; pp. 181-182.

* cited by examiner

*Primary Examiner* — Roy M Punnoose
(74) *Attorney, Agent, or Firm* — Young & Thompson

(57) ABSTRACT

3D imager including at least one pixel, each pixel including a photodetector for detecting photon incidence and a time-to-digital converter system configured for referencing the photon incidence to a reference clock, and further including a reference clock generator provided for generating the reference clock, wherein the reference clock generator is configured for adjusting the frequency of the reference clock on the basis of an estimated time up to a subsequent photon incidence.

19 Claims, 15 Drawing Sheets

Fig. 14 SPAD

US 9,419,635 B2

TIME-TO-DIGITAL CONVERTER AND METHOD THEREFOR

TECHNICAL FIELD

The present invention relates to the field of 3D imaging.

BACKGROUND ART

The interest in high performance three-dimensional (3D) imaging has grown in recent years due to immense demand in engineering, science, medicine and entertainment domains. The driving goals of state-of-the-art 3D imagers are high sensitivity to light and fine depth resolution at long range. Furthermore, high level of integration is desirable to achieve low system cost. To meet these demands, the industry has started to transition from traditional analog techniques to standard CMOS based solutions. A key component of a 3D imager is a time-to-digital converter (TDC).

Known TDC schemes, especially those used for Time to Distance conversions, comprise a Coarse-Fine architecture where the most power consuming part, the coarse interpolator, is active throughout to count the clock cycles. It has been found that these known schemes have high power consumption when used in imager applications.

DISCLOSURE OF THE INVENTION

It is an aim of the present invention to provide a 3D imager and a method for 3D imaging with reduced power consumption.

These and other aims are achieved according to the invention as defined in the claims.

In an aspect, the invention provides a 3D imager device comprising at least one pixel, preferably an array of pixels, in each pixel a photodetector for detecting photon incidence and a time-to-digital converter system configured for referencing said photon incidence to a reference clock, and further comprising a reference clock generator provided for generating the reference clock, wherein the reference clock generator is configured for adjusting the frequency of the reference clock on the basis of an estimated time up to a subsequent photon incidence. The 3D imagers may be applicable for use in machine vision systems, face recognition systems, security systems, human-computer interaction applications, gaming, etc.

It has been found that if the frequency of the reference clock can be adapted to the desired object range, i.e. the estimated time up to the subsequent photon incidence (e.g. dependent on the distance towards an object), it can be reduced whenever possible to save power.

In an embodiment, the reference clock period is adjustable and can be made equivalent to the object range of the imager, so that the relevant event falls within the period of the reference clock. The time-of-flight measurement is then given by TotalTime=[T−(N×t)] wherein "T" is the reference clock period, "t" is the fine TDC time interval and N is the number of fine TDC time intervals counted up to the next reference clock cycle. It has been found that this embodiment, with an adjustable reference clock, can be introduced to drastically reduce the power consumption of a 3D imaging system.

In embodiments according to the invention, an event driven time-to-digital converter may be applied in each pixel, which may comprise a high resolution TDC, organized such that it is activated in response to an event detection signal, generated by the photodetector, and deactivated in response to the reference clock. So in fact, according to embodiments of the invention, the TDC is only activated to measure a relevant part of a larger time interval, e.g. a reference clock cycle, to determine only the offset of a detected event with respect to a subsequent edge of the reference clock. In this way, power consumption can be further reduced.

In embodiments according to the invention, the time-to-digital converter may comprise a fine resolution part configured for counting fine time intervals, and may be organized such that the fine resolution part is activated in response to the event detection signal and deactivated in response to a reference clock. The fine resolution part is configured for counting fine time intervals of which the duration is (much) shorter than the period of the reference clock. The duration of the fine time intervals can be chosen according to the desired resolution of the time-to-digital conversion.

In embodiments of a time-to-digital converter system according to the invention, the time-to-digital converter may comprise a coarse resolution part configured for counting coarse time intervals determined by a characteristic of the fine resolution part. For example, the fine resolution part may comprise a ring oscillator, the characteristic being the oscillation cycle period of the ring oscillator.

In another aspect, the invention provides a method for 3D imaging, comprising the steps of:
a) generating a reference clock;
b) providing said reference clock to at least one pixel of a 3D imager;
c) detecting photon incidence by means of a photodetector (100) of each pixel;
d) referencing said detected photon incidence to the reference clock by means of a time-to-digital converter system provided in each pixel;
e) adjusting the frequency of the reference clock on the basis of an estimated time up to a subsequent photon incidence.

Embodiments and advantages of the method for 3D imaging are equivalent to those of the 3D imager, embodiments of which have been set out above, and will not be repeated here for the sake of brevity.

BRIEF DESCRIPTION OF THE DRAWINGS

The invention will be further elucidated by means of the following description and the appended figures.

MODES FOR CARRYING OUT THE INVENTION

Figure 1:
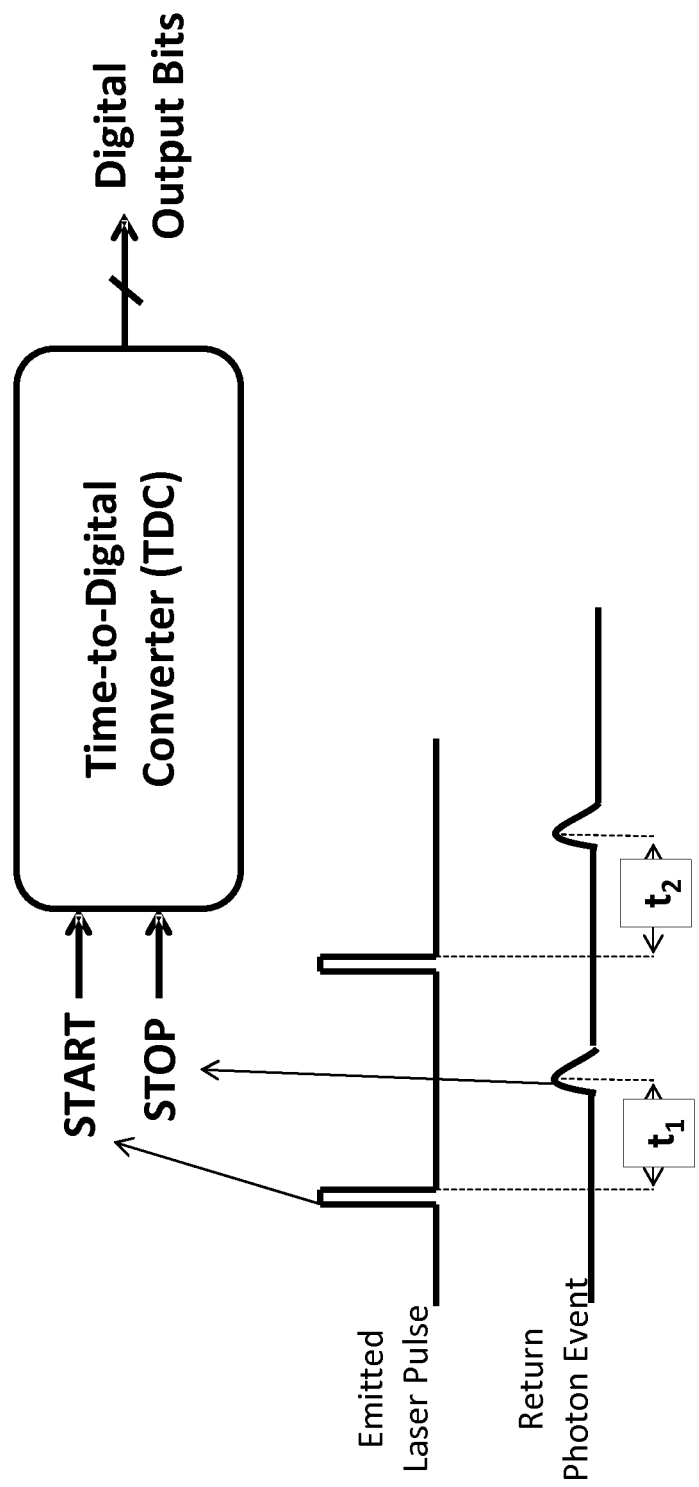
FIG. 1 shows the general concept and operation of a TDC system.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

Furthermore, the various embodiments, although referred to as "preferred" are to be construed as exemplary manners in which the invention may be implemented rather than as limiting the scope of the invention.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present invention, the only enumerated components of the device are A and B, and further the claim should be interpreted as including equivalents of those components.

With reference to FIG. 1, a general operation principle of a 3D imager, which is also applied in embodiments described herein, is explained. The principle is Time Correlated Single Photon Counting (TCSPC). It is based on correlation of time-of-arrival (ToA) of incident photons. It is a pulsed based scheme specific to the detection of single photons and correlation of their ToA to obtain the distance information.

In this scheme, generally, multiple single-photon measurements are obtained and high resolution can be achieved with statistical processing. This helps to realize millimeter level accuracy even at low photon counts or in the presence of large background illumination.

TCSPC is useful for a variety of applications such as measuring the lifetime of a fluorescent marker while studying a biological specimen or for understanding the metabolic activity in positron emission tomography (PET). Apart from this, this approach finds various other applications such as optical range-finding, fluorescence correlation spectroscopy (FCS), Forster resonance energy transfer (FRET), and fluorescence lifetime imaging microscopy (FLIM).

This disclosure extends the art in TCSPC applications. The 3D imager proposed herein is aimed at security and surveillance applications and the system objectives can be met using TCSPC approach to design. The system is preferred to be sensitive to wavelengths in non-visible range and to work for low photon counts or dim lit areas with high resolution at low power. In the following, the building blocks of TCSPC based 3D imagers, according to embodiments of this disclosure, are described.

Figure 2:
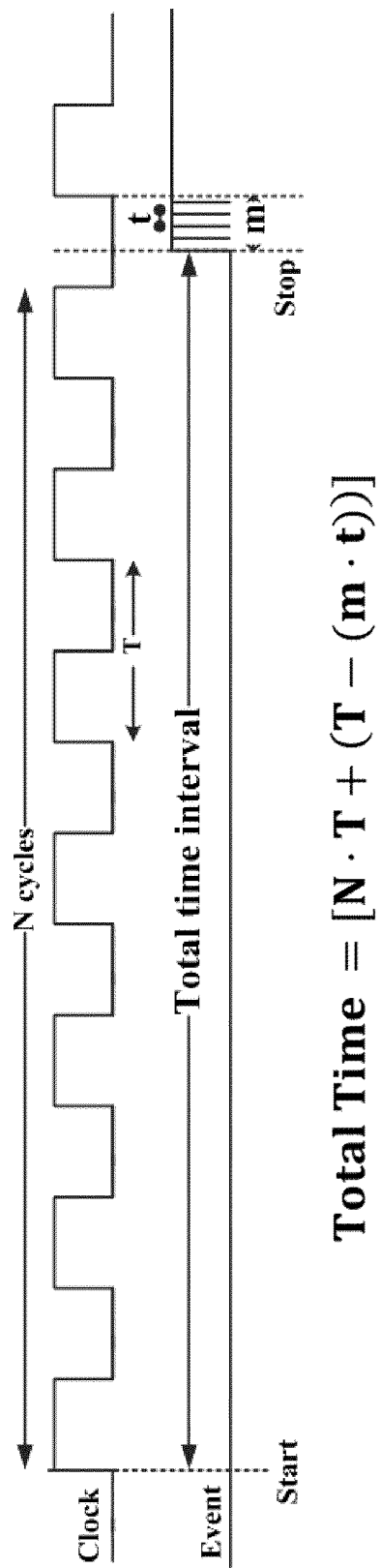
FIG. 2 shows a timing scheme of a prior art system for time-to-digital conversion.

In a prior art coarse-fine TDC architecture, shown in FIG. 2, the positive edge of the reference clock was the START signal for the coarse TDC part whereas the STOP signal was a photon detection event, in particular by means of a single photon avalanche diode (SPAD). So the coarse TDC part is active and consuming power, from the reference point in time up to the event detection whereas the fine TDC part performs interpolation from the STOP signal until the next clock edge to determine fine time intervals and is active for a short time only. The coarse-part consumes a lot of power in counting the reference clock cycles and is active irrespective of an event occurrence.

In order to conserve power, another approach to time interval measurement is proposed herein. In the configuration of the invention, the photon arrival triggers the START signal while the subsequent reference clock edge is used as the STOP signal. In this scheme, the fine TDC part is event driven, only becomes active when the relevant event occurs, and is only active for a short time period, thereby reducing the overhead as compared to an always-running coarse-counter as in the prior art coarse-fine TDC approach. The TDC is only activated, START, upon detection of an event and deactivated, STOP, at the next edge of the reference clock. In embodiments according to the invention, the TDC has a fine resolution part which counts fine time intervals "t" and a coarse resolution part which counts coarse time intervals, a multiple of "t". So the fine TDC part quantizes the time residue between the event detection and its closest reference clock edge in small time steps "t", resulting in high resolution.

In an embodiment, the reference clock period is adjustable and can be made equivalent to the maximum range of the imager (e.g. 10 m or 66 ns), so that the relevant event falls within the period of the reference clock. Alternatively, close to an integer multiple reference clock cycles can be fit between START and STOP events such that the last reference clock is active in capturing the time-of-flight event. This may imply a system clock frequency of e.g. ~15 MHz which may result in much lower power for a clock distribution circuit than at 10 GHz. However, it may also mean that each TDC is active for a longer period (up to 66 ns). The time-of-flight measurement is then given by TotalTime=[T−(N×t)] wherein "T" is the reference clock period, "t" is the fine TDC time interval and N is the number of fine TDC time intervals counted up to the next reference clock cycle (see FIG. 3), by means of the fine and coarse resolution parts.

Figure 15:
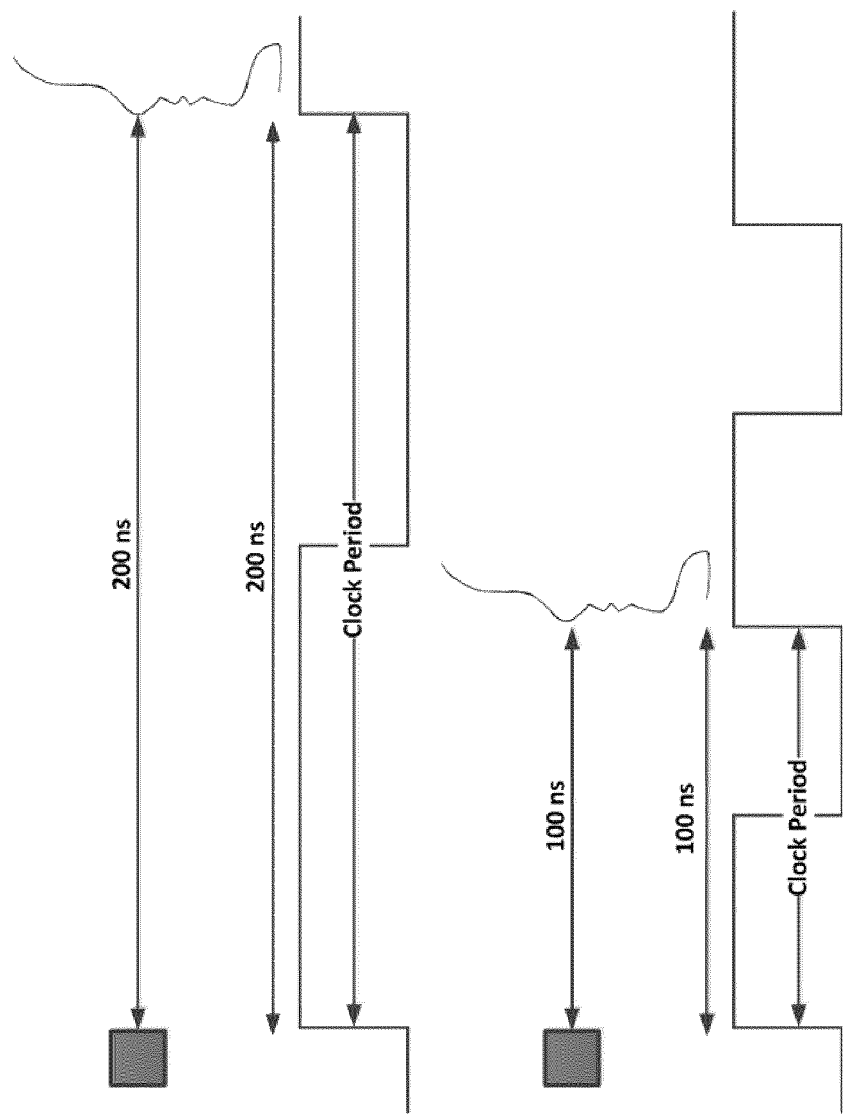
FIG. 15 shows the concept of adapting the reference clock frequency to the range of an object to be measured, according to embodiments of the invention.

It has been found that this embodiment, with an adjustable reference clock, can be introduced to drastically reduce the power consumption of a system comprising e.g. a million pixel array. The principle is that the range of object is first estimated in a couple of measurements and then the system adapts to this known range for its further operation (see FIG. 15). For example, the lowest clock frequency in such a system may be 5 MHz which corresponds to 200 ns (or 30 m) of maximum object range. However, if the object range is less than e.g. 30 m, then the reference clock can be increased to match the range. To give an example, if the range of object in focus is 15 m, the clock frequency can be increased to 10 MHz from the initial frequency of 5 MHz. As a way of example, the adjustable reference clock can be obtained through edge division of a high-frequency (e.g., 10 GHz) system clock, which is used to stabilize the emitting laser.

It has been found that with this modification in clock frequency, the time duration for which the TDC is in operation can be reduced by half, thereby drastically reducing the power consumption.

Figure 3:
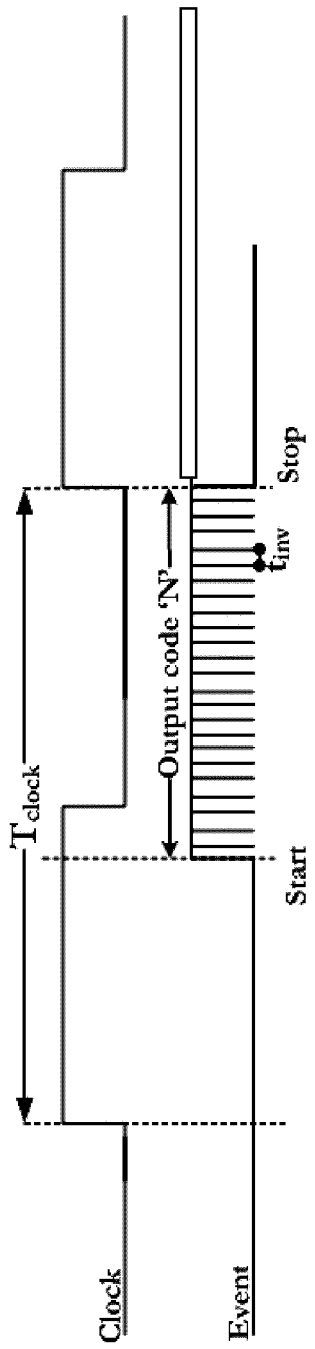
FIG. 3 shows an embodiment of a timing scheme for time-to-digital conversion according to the invention.

In FIGS. 2 and 3, a positive clock edge is used for deactivating the TDC. In the embodiments described below, a negative clock edge is used for this.

Figure 4:
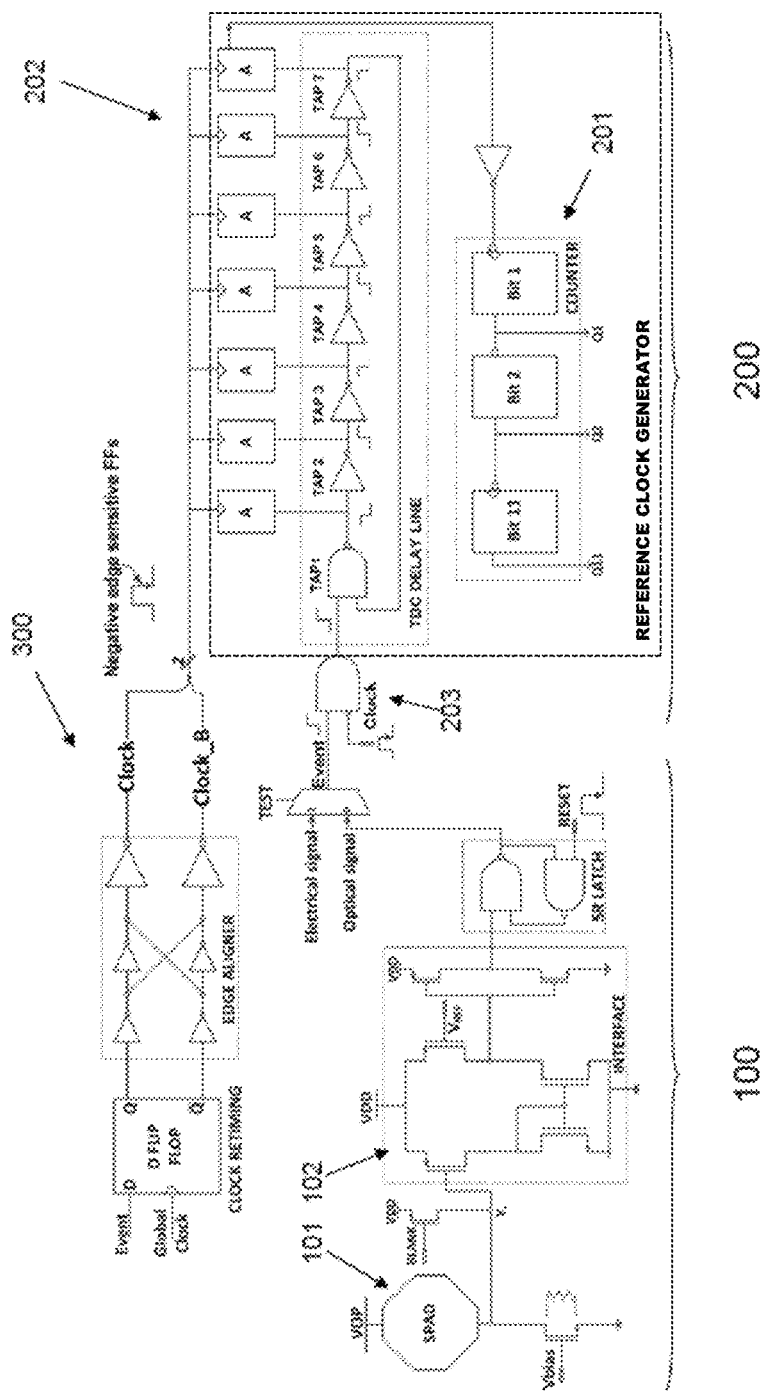
FIG. 4 schematically shows an embodiment of a complete pixel circuit of a 3D imager according to the invention.
Figure 12:
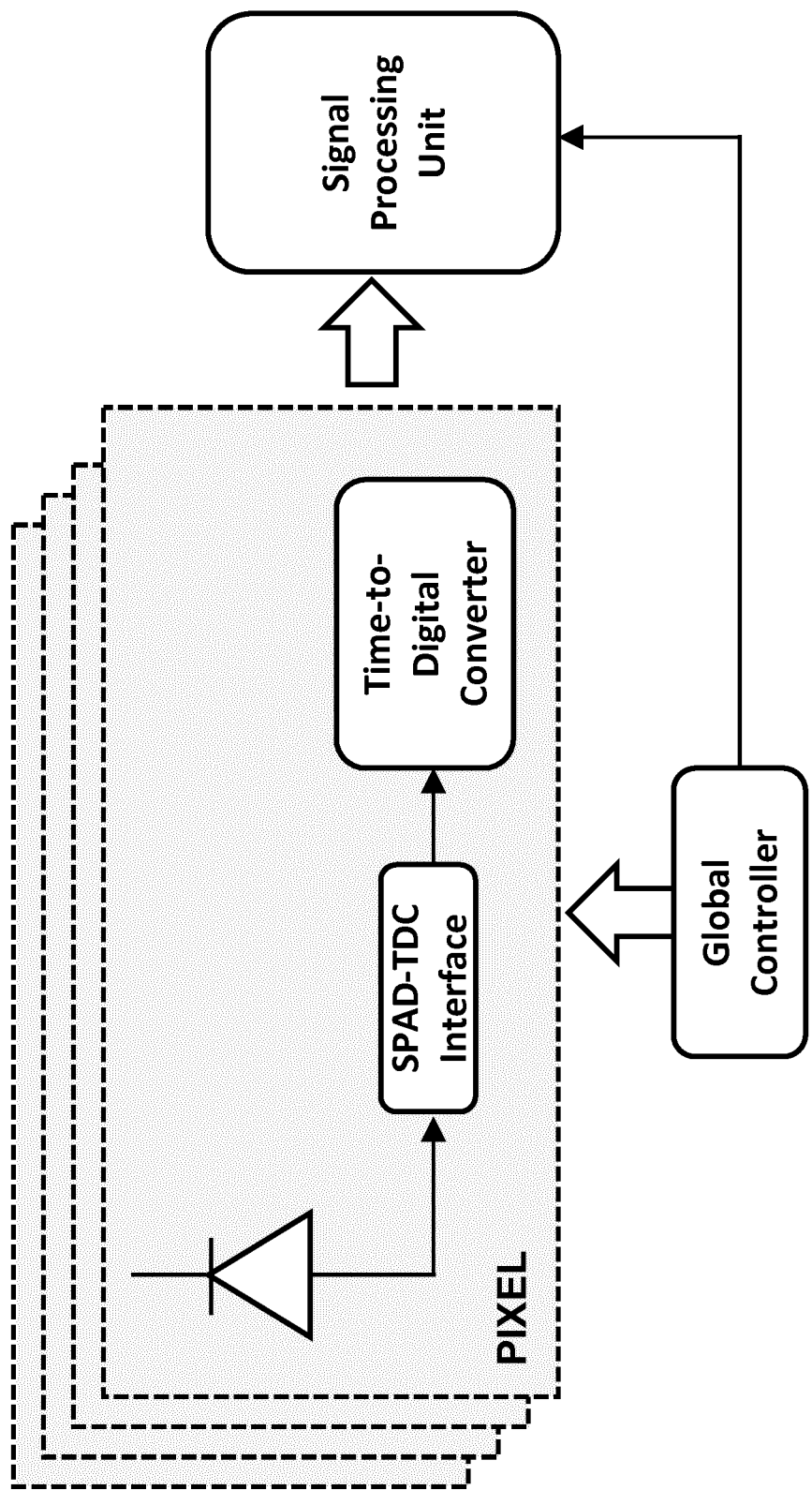
FIG. 12 schematically shows a system architecture of a 3D imager according to the invention.

An embodiment of a complete pixel circuit is shown in FIG. 4. It comprises an event detector 100, comprising a SPAD 101 and interface circuitry 102; a TDC 200, comprising a coarse resolution part 201 which follows a fine resolution part 202 and an AND-gate 203 as controller for activating/deactivating the fine resolution part; and a gating device 300, comprising a clock retiming circuit and an edge aligner for gating the reference clock. A MUX gate is added at the input of the TDC to allow selection between an optical or electrical input. The electrical input from off-chip can be used for evaluating TDC performance and for its calibration. The SPAD photodetector, TDC and readout mechanism are controlled by a global controller (FIG. 12). This controller also regulates the signal processing to obtain a compressed timestamp for image reconstruction. The controller also handles the reference clock distribution to the pixel array.

Figure 5:
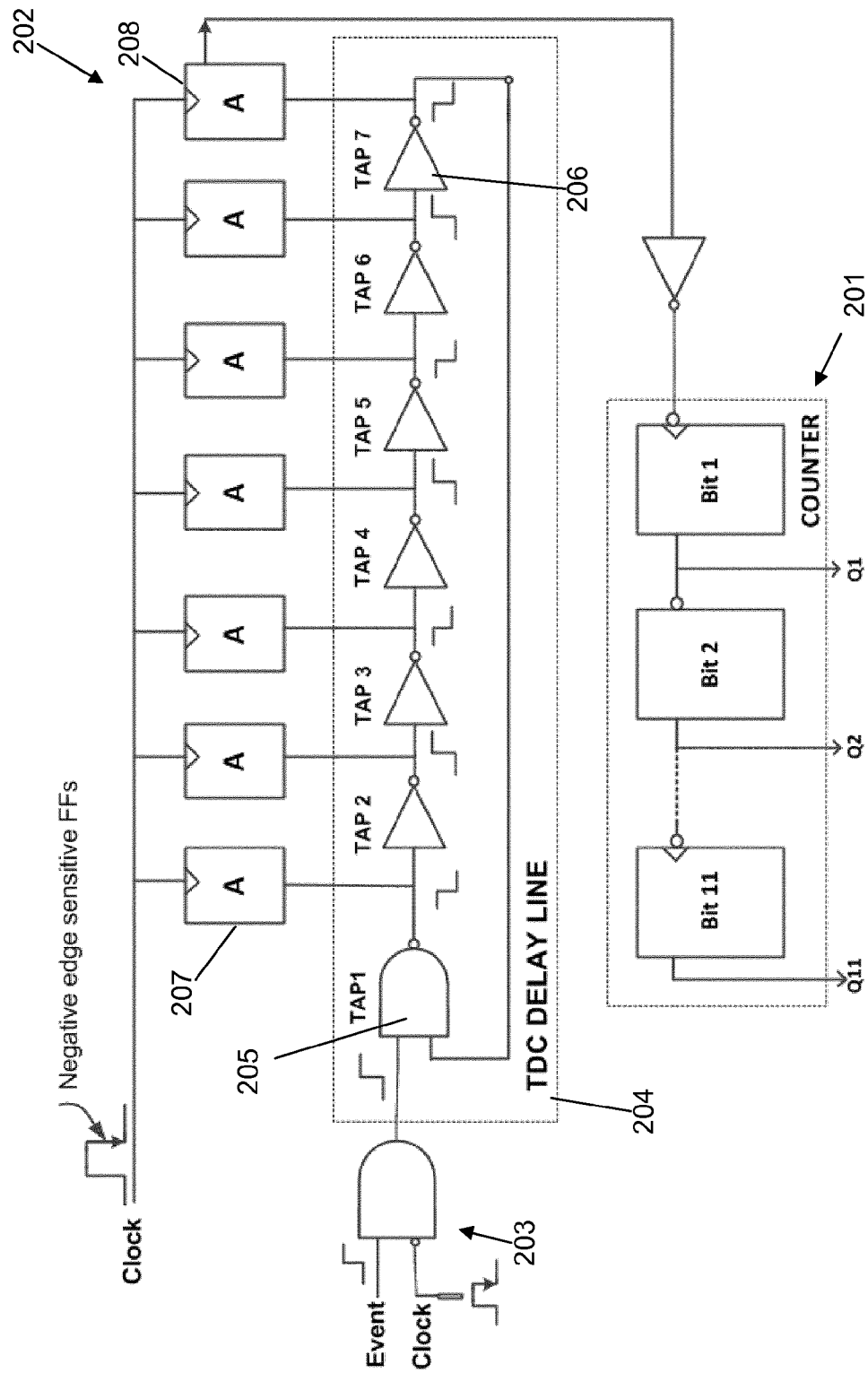
FIG. 5 shows a detail of the TDC of the pixel circuit of FIG. 4.

FIG. 5 shows a detail of the TDC 200. A looped architecture of TDC is shown. As the ring 204 starts to oscillate, the binary counter 201 increments every alternate cycle. With such a counter, it is easy to extend the dynamic range of the imager to higher-order bits. The delay line produces an N-bit pseudo-thermometer code which can be converted to log2 (N+1) bit binary code to be merged with the M-bit counter code, with M=11 shown as an example.

The control of ring oscillation is required for the correct TDC operation and also to reduce power consumption. In a preferred embodiment, an AND-gate 203 was selected as a controller, for the following advantages:
  (i) Initial state is known as the AND gate output is logic '0' when START (here EVENT signal) is '0'.
  (ii) No extra logic in the ring.
  (iii) The STOP (or 'Clock' signal) has a single AND gate input load.

The control signals for the TDC are:
  (a) START: It indicates the occurrence of an event and is generated when a photon hits the SPAD. A leading edge of START signal triggers the ring oscillation.
  (b) STOP: It indicates the arrival of system clock and stops the TDC ring oscillation. The clock also captures the state of delay line. Both the delay line latches and TDC operation are controlled by the falling edge of the clock.

The choice of delay line arbiters 207, 208 may be critical in TDC design from both area and power perspective. An arbiter structure is required to capture the state of the delay line when the clock (STOP) arrives. In the preferred TDC architecture, an inverter is the delay tap of the ring. Since there is a single delay line, as shown FIG. 5, only single phase data input is available for arbiter input. Furthermore, the delay line changes its state at a high frequency due to ring oscillation behaviour. Different flip-flop and latch configurations are possible, but the most suitable arbiter design is found to be a switched inverter based latch as shown in FIG. 6.

Figure 6:
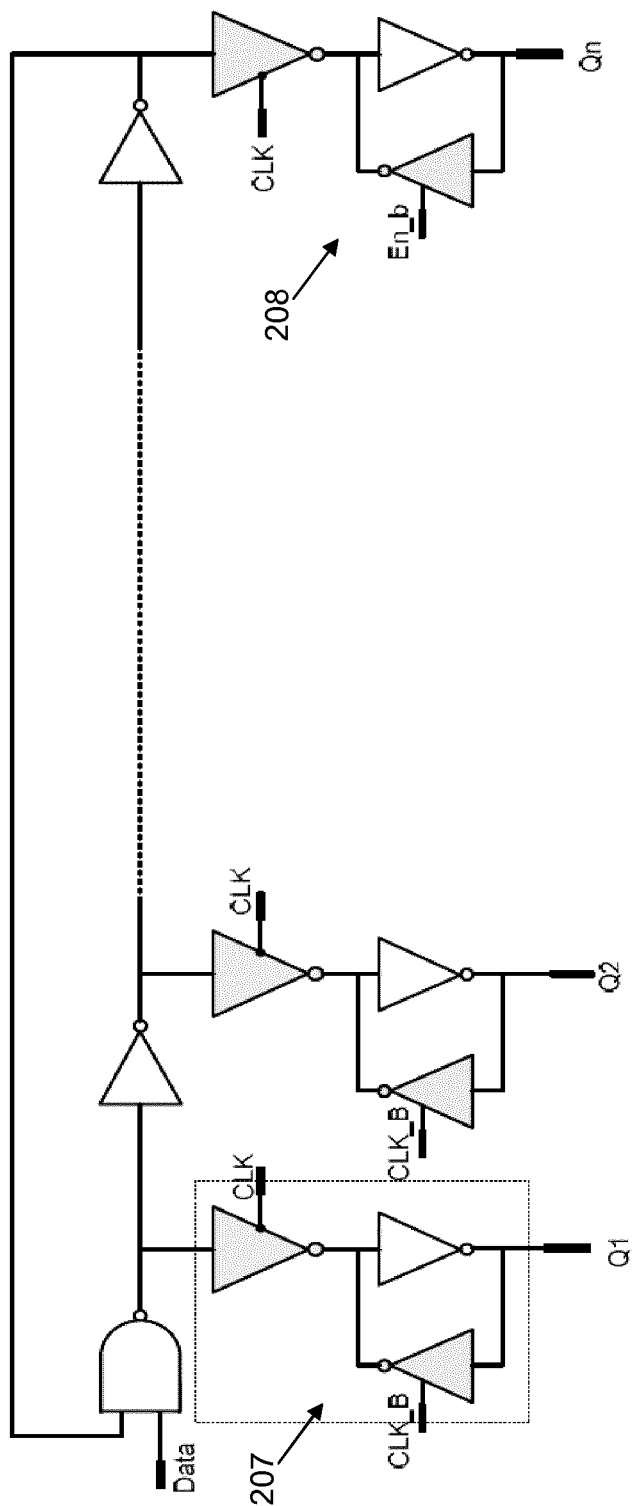
FIG. 6 shows a detail of a ring oscillator with switched inverter based latches used in the TDC of FIG. 5.

The latch shown in FIG. 6 propagates the signal when its 'Enable' is HIGH. When the 'Enable' signal is LOW, the feedback inverter holds the output. It differs from SR latch structures as there is no change in output once clock arrives and it holds the data. Furthermore, it has symmetric behavior w.r.t. rising and falling input signals. To summarize, it has the following properties:
  (i) it requires single-phase data along with true and complementary clock signal,
  (ii) the architecture is compact; only 10 transistors may be sufficient as opposed to e.g. master/slave flip-flop,
  (iii) the TDC resolution remains the best possible as it loads the delay line by a single inverter,
  (iv) it is static in nature and holds data as long as clock gating exists. Thus, the readout can be done at a later point of time.

The output code of TDC is binary in nature as the counter increments by one bit when the ring completes two cycles. The easiest placing for a counter could be at the output of any delay stage. However, placing the counter at the last delay tap seems a logical way to ease the output code generation. It has been found that the placing of the counter at the output of any delay tap however creates two issues:
  (i) The loading faced by delay tap is different w.r.t other delay taps. In case of the last delay tap, it feeds a bigger NAND gate along with a counter flip-flop. Thus, it experiences a higher loading than other delay taps.
  (ii) The offset in counter's output code is different from that of delay line latches' output code. This can be understood with an example—every arbiter (latch or a flip/flop) has a setup time, say 100 ps. If a transition arrives at instant 'T' ps at the last delay tap, the delay line outputs would correspond to (T−100) ps whereas the counter outputs would correspond to T ps. This brings in a mismatch in offset among two output codes.

In order to solve the above mentioned issues, a different placement of the counter is proposed as shown in FIG. 5. If the counter is placed at the output of last stage's arbiter 208, the mismatch in offset is zero. Furthermore, the loading of last stage of delay line is reduced.

The delay line presents a pseudo-thermometer code whereas the counter generates a 10-bit binary code. The 7-bit pseudo thermometer code is equivalent to 3 binary bits. It should also be noted that the last delay tap output is the inverse of the LSB bit of binary code. Thus, the counter has been designed for 10 bits instead of 11 bits. The conversion of pseudo-thermometer code to binary code along with accounting for 11th bit could be done during post-processing outside the chip.

Figure 7:
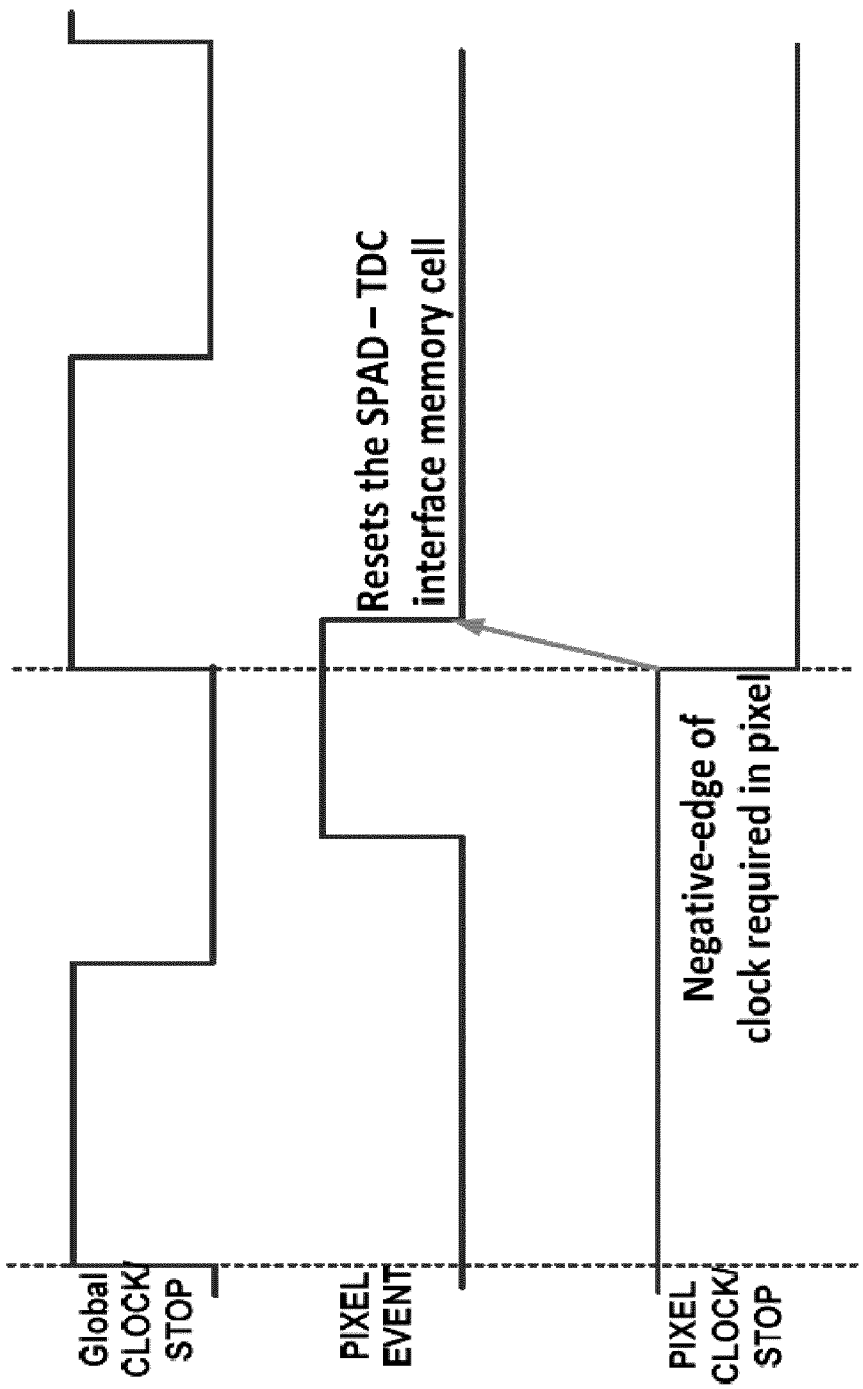
FIG. 7 shows a timing scheme in which a reference clock is gated with an event detection signal, according to embodiments of the invention.
Figure 8:
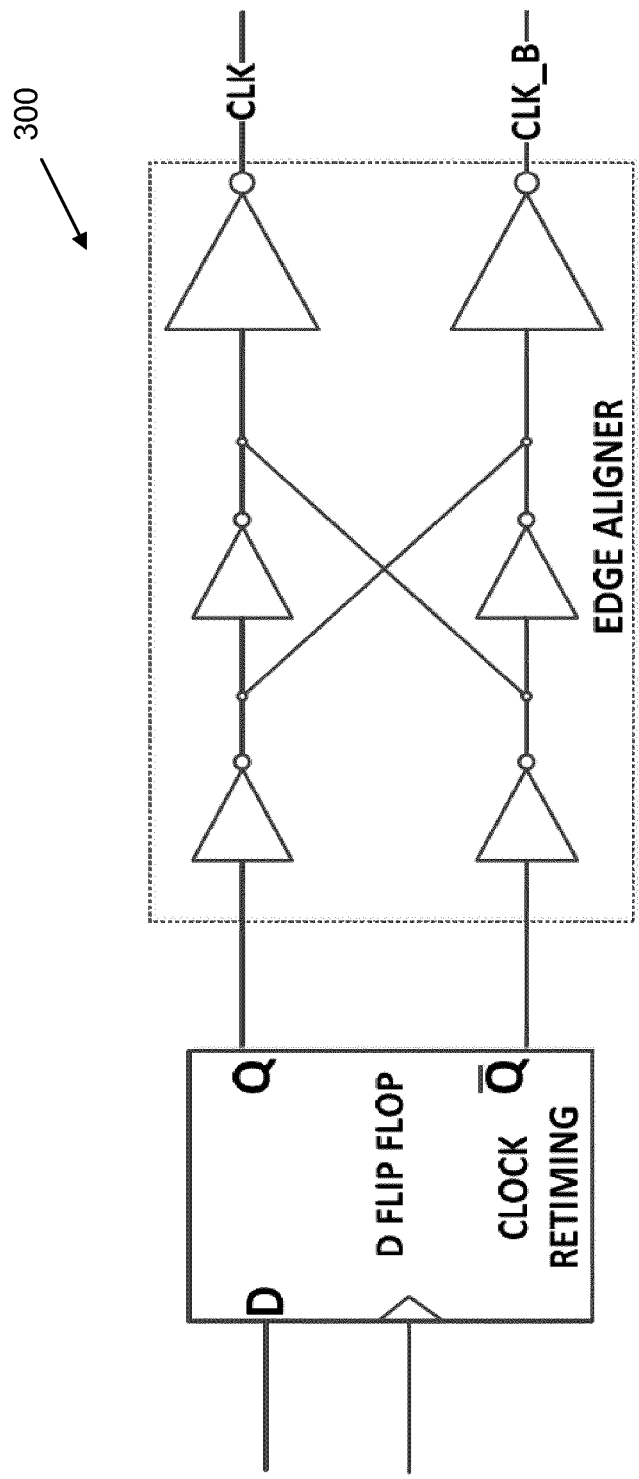
FIG. 8 shows a detail of a gating device, used in the pixel circuit of FIG. 4.

With reference to FIGS. 7 and 8, the gating device 300 and its purpose will now be described. It is used in order to avoid timing issues associated with clock tree and simplify the clock tree design, so to relax the requirements on clock tree network. By this approach, the global constraints are transferred to be handled locally in each pixel. For this purpose, an additional block 300 is introduced at a pixel level, namely a Clock Retiming and Edge Aligner block which is responsible for the following:
  (a) It retimes the clock such that the clock is presented to the entire pixel circuitry only when an event (a photon arrival) has taken place (see FIG. 7). This ensures that the TDC state remains unchanged until the next photon hits the SPAD. It can also reduce redundant switching in the circuitry lowering the power consumption.
  (b) It aligns the clock edges with smaller skew to ensure the correct TDC performance.

With such clock retiming and edge alignment in each pixel, the task of clock distribution reduces to single clock distribution at the global level.

Figure 9:
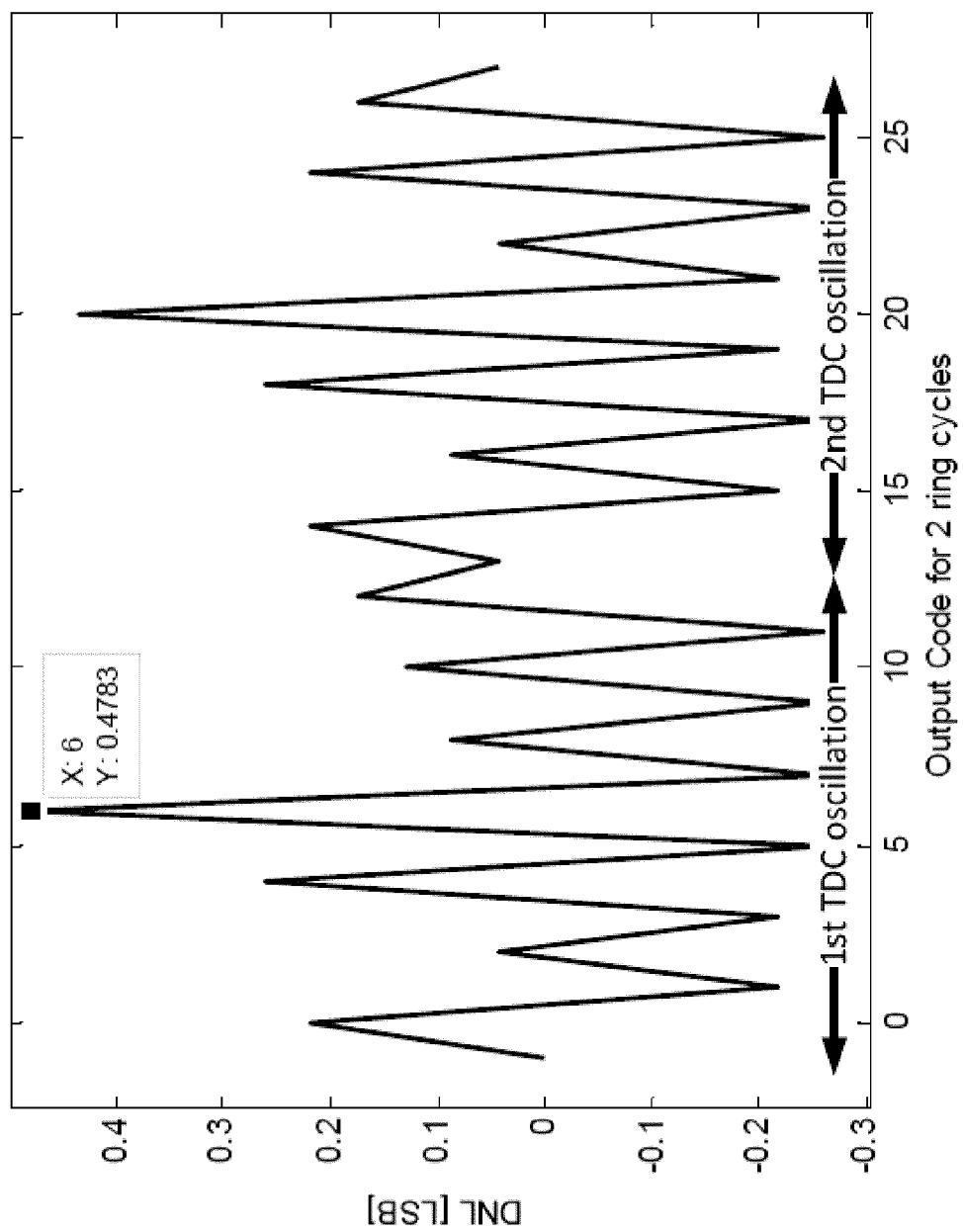
FIG. 9 shows the differential non-linearity of TDC
Figure 10:
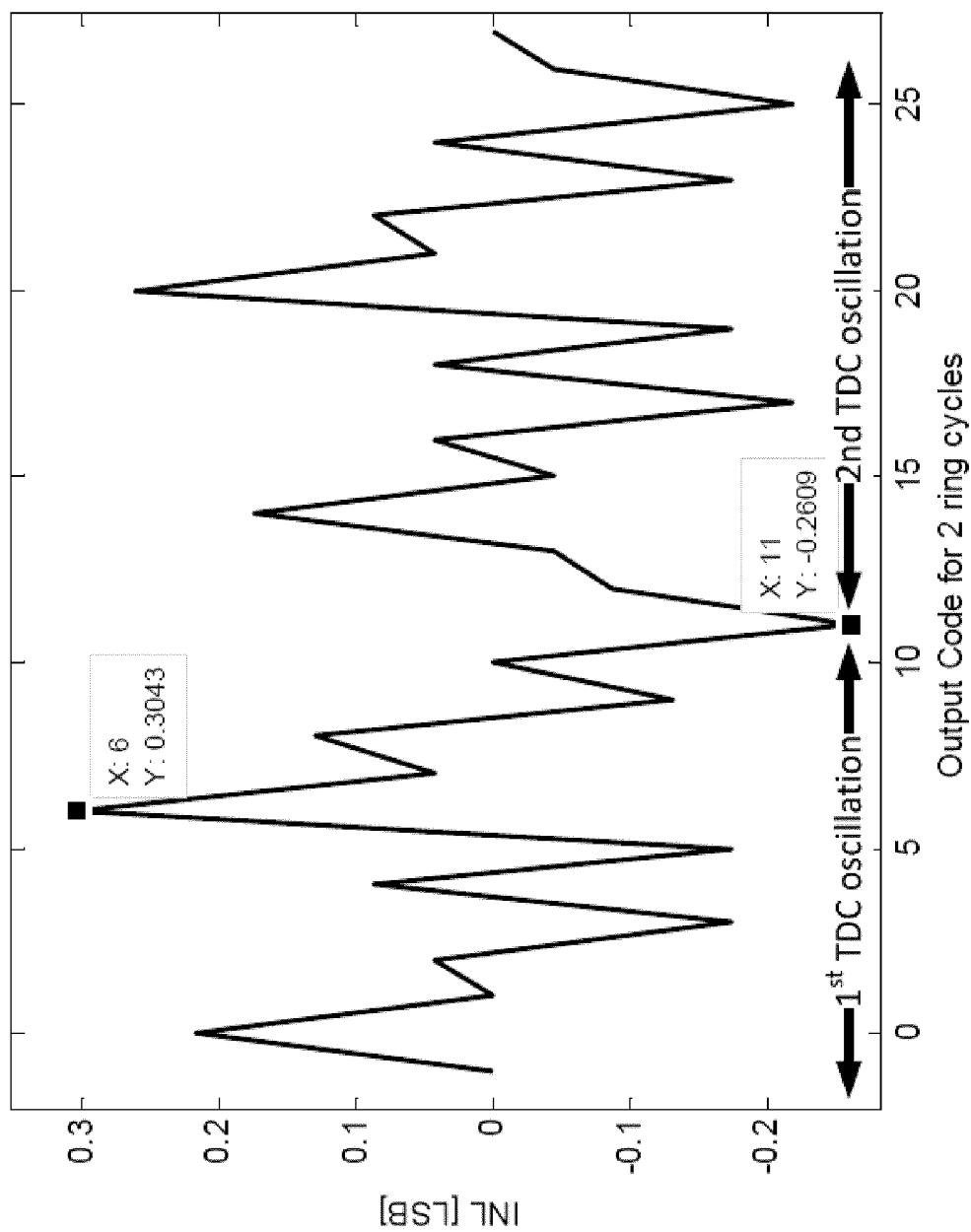
FIG. 10 shows the integral non-linearity of TDC.

It has been found that the proposed ring oscillator based TDC described above achieves a good linearity with DNL MAX=0.48 LSB and INL MAX=0.3 LSB. The linearity analysis is conducted over 2 TDC oscillations where each oscillation has 14 delay taps. Since the results obtained in both TDC oscillations are coherent with each other, it can be assumed that every cycle of TDC has the similar behavior across all its oscillations. In the DNL plot shown in FIG. 9, we observe that the DNL behavior of both oscillations is similar with a maximum DNL of 0.48 LSB. The maximum DNL occurs at half oscillation or when the propagation returns back to the first delay tap (NAND gate). The INL plot shown in FIG. 10 also shows the same effect. The linearity results are as expected from the TDC architecture and since INL<1 LSB, the accuracy of the system is not limited by TDC linearity.

Figure 11:
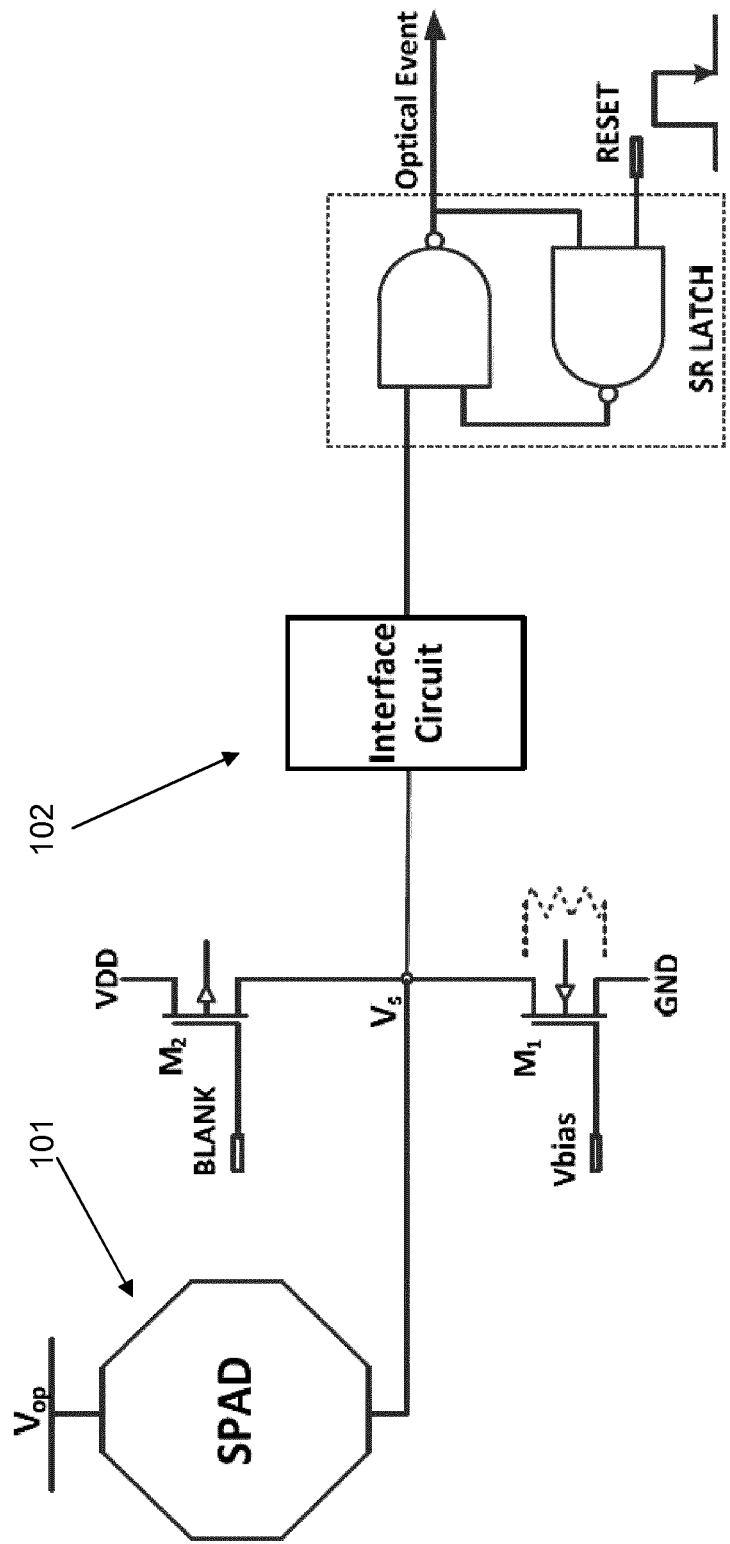
FIG. 11 shows a detail of a SPAD and interface circuitry of the pixel circuit of FIG. 4.
Figure 14:
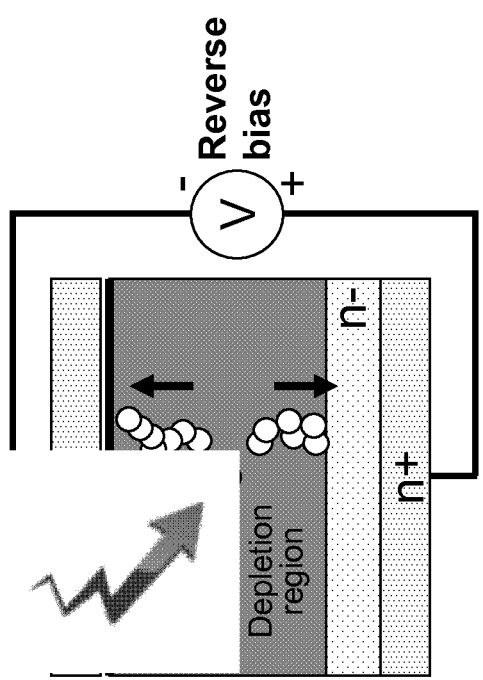
FIG. 14 shows a detail of a SPAD.

With reference to FIGS. 11 and 14, a single photon avalanche detector and its operation are described. When a SPAD biased above breakdown, in Geiger mode, absorbs a single photon in the visible and near-infrared wavelength range, an avalanche is created which indicates occurrence of an event. To control the SPAD operation, a front-end interface circuitry is required for the following tasks:

Sensing: The photon absorption indicates an event occurrence which needs to be propagated to TDC.
Quenching: After avalanche occurs, it needs to be halted to avoid large flow of current in the circuit.
Recharge: The SPAD needs to be re-biased in Geiger mode to be able to detect a photon again.

In the SPAD-TDC interface circuitry shown in FIG. 11, the transistor $M_1$ acts as ballast resistance. Its gate voltage is tunable from off-chip and thus, the resistance can be varied externally. $M_2$ is used as a blanking control for SPAD. If BLANK signal is logic LOW, $M_2$ conducts and biases the SPAD below breakdown. In this way, it turns off the SPAD. The interface circuit connected to node Vs needs design focus as it senses the SPAD signal and indicates the occurrence of an event. It acts as a START signal for the TDC. Finally, the SR latch keeps the START signal to logic HIGH until the clock arrives to reset it.

Figure 13:
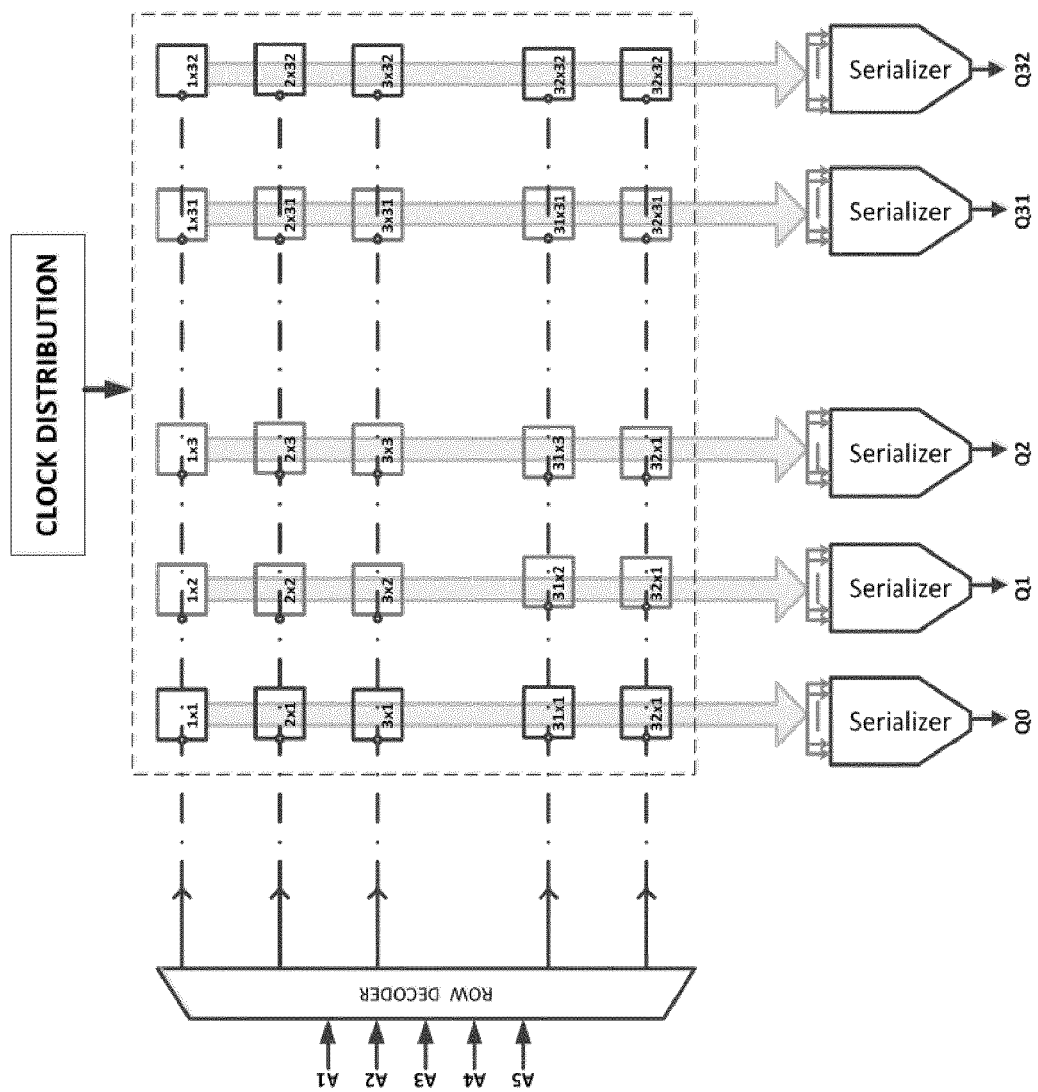
FIG. 13 schematically shows readout circuitry for reading out a pixel array of a 3D imager, according to embodiments of the invention.

FIG. 13 shows a possible implementation of a readout circuitry for the imager. To enable column-based readout, a row decoder and a serializer are required to select the pixel and then convert its parallel data into serial bits. Thus, in a 32×32 imager array as shown, the readout has the following functions:

a. A row selection is made to select a pixel in the column by a row decoder.
b. The multi-bit pixel data is loaded in the column bus through access transistors.
c. The data is latched in the serializer FFs.
d. The serializer shifts the parallel data serially out of the chip.

In the embodiments described above, a SPAD is used for photon detection. In alternative embodiments, a PN photodiode, a photogate, or any other device for detecting photon incidence known to the skilled person could also be used. More in general, the proposed TDC is applicable to characterize also other events than detection of photons or light and outside the field of 3D imaging.

The invention claimed is:

1. 3D imager comprising at least one pixel, each pixel comprising:
a photodetector for detecting photon incidence;
a reference clock generator that generates a reference clock; and
a time-to-digital converter system configured for referencing said photon incidence to the reference clock, wherein the reference clock generator adjusts a frequency of the reference clock such that photon incidence occurs in each pixel in each cycle of the reference clock.

2. 3D imager according to claim 1, wherein the reference clock generator is configured for determining the frequency of the reference clock from a first series of measurements.

3. 3D imager according to claim 2, configured for determining said estimated time from a measured distance up to an object to be imaged.

4. 3D imager according to claim 1, wherein the photodetector comprises a single photon avalanche diode and an interface circuit for interfacing the single photon avalanche diode with the time-to-digital converter system.

5. 3D imager according to claim 1, wherein the time-to-digital converter system comprises an event driven time-to-digital converter of which a fine resolution part is only activated following said photon incidence.

6. 3D imager device according to claim 5, wherein the fine resolution part is configured for counting fine time intervals, and wherein the time-to-digital converter is organized such that the fine resolution part is activated in response to an event detection signal and deactivated in response to the reference clock.

7. 3D imager device according to claim 6, wherein the time-to-digital converter further comprises a coarse resolution part configured for counting coarse time intervals determined by a characteristic of the fine resolution part.

8. 3D imager device according to claim 7, wherein the fine resolution part comprises a ring oscillator and wherein the characteristic of the fine resolution part is its oscillation cycle period.

9. 3D imager according to claim 1, comprising a plurality of said pixels arranged in an array, said reference clock being distributed to each of said pixels.

10. 3D imager according to claim 1, wherein,
the photodetector is comprised of a single photon avalanche diode connected to an interface circuit that interfaces the single photon avalanche diode with the time-to-digital converter system,
the time-to-digital converter system is activated in response to an event detection signal generated by the photodetector and deactivated in response to the reference clock,
the time-to-digital converter system is comprised of a fine resolution part followed by a coarse resolution part,
the fine resolution part is only activated following said photon incidence and the fine resolution part counts fine time intervals having a duration shorter than a period of the reference clock, the fine resolution part comprising a ring oscillator, and
the coarse resolution part counts coarse time intervals determined by an oscillation cycle period of the ring oscillator.

11. A method for 3D imaging comprising the steps of:
a) generating a reference clock;
b) providing said reference clock to at least one pixel of a 3D imager;
c) detecting photon incidence by means of a photodetector of each pixel;
d) referencing said detected photon incidence to the reference clock by means of a time-to-digital converter system provided in each pixel;
e) adjusting the frequency of the reference clock such that photon incidence occurs in each pixel in each cycle of the reference clock.

12. A method for 3D imaging according to claim 11, wherein said frequency is adjusted subsequent to a first series of measurements.

13. A method for 3D imaging according to claim 11, wherein said frequency is determined from a measured distance up to an object to be imaged.

14. A method for 3D imaging according to claim 11, wherein said photodetector comprises a single photon avalanche diode and an interface circuit for interfacing the single photon avalanche diode with the time-to-digital converter system.

15. A method for 3D imaging according to claim 11, wherein the time-to-digital converter system comprises an event driven time-to-digital converter of which a fine resolution part is only activated following said photon incidence.

16. A method for 3D imaging according to claim 15, wherein the fine resolution part is configured for counting fine time intervals, and wherein the time-to-digital converter is organized such that the fine resolution part is activated in response to the event detection signal and deactivated in response to a reference clock.

17. A method for 3D imaging according to claim 16, wherein the time-to-digital converter further comprises a coarse resolution part configured for counting coarse time intervals determined by a characteristic of the fine resolution part.

18. A method for 3D imaging according to claim 17, wherein the fine resolution part comprises a ring oscillator and wherein the characteristic of the fine resolution part is its oscillation cycle period.

19. A method for 3D imaging according to claim 11, wherein the 3D imager comprises a plurality of said pixels arranged in an array, said reference clock being distributed to each of said pixels.

* * * * *